United States Patent
Lin et al.

(10) Patent No.: US 9,711,190 B2
(45) Date of Patent: Jul. 18, 2017

(54) STABILIZING CIRCUIT

(71) Applicant: Taiwan Semiconductor Manufacturing Company Limited, Hsin-Chu (TW)

(72) Inventors: Kai-Chun Lin, Hsinchu (TW); Hung-Chang Yu, Hsin-Chu (TW); Ku-Feng Lin, New Taipei (TW); Yue-Der Chih, Hsin-Chu (TW)

(73) Assignee: TAIWAN SEMICONDUCTOR MANUFACTURING CO. LIMITED (TW)

( * ) Notice: Subject to any disclaimer, the term of this patent is extended or adjusted under 35 U.S.C. 154(b) by 0 days.

(21) Appl. No.: 14/249,428

(22) Filed: Apr. 10, 2014

(65) Prior Publication Data
US 2015/0294696 A1 Oct. 15, 2015

(51) Int. Cl.
*G11C 7/08* (2006.01)
*G11C 7/06* (2006.01)
*G11C 5/14* (2006.01)

(52) U.S. Cl.
CPC .............. *G11C 5/147* (2013.01); *G11C 7/062* (2013.01); *G11C 7/08* (2013.01); *G11C 2207/063* (2013.01)

(58) Field of Classification Search
CPC ....... H01L 2924/13091; H01L 27/0251; H03F 3/45179; H03F 1/301; H03F 1/223; G11C 11/4074; G11C 5/147; G11C 27/024; G11C 7/06; G11C 7/1051
See application file for complete search history.

(56) References Cited

U.S. PATENT DOCUMENTS

| | | | | |
|---|---|---|---|---|
| 4,959,812 A * | 9/1990 | Momodomi | ........... | G11C 16/16 257/316 |
| 5,940,322 A * | 8/1999 | Atsumi | ................... | G05F 3/262 365/185.18 |
| 6,009,032 A * | 12/1999 | Lin et al. | ...................... | 365/208 |
| 6,803,809 B2 * | 10/2004 | Saitoh | ....................... | G05F 1/56 323/313 |
| 6,845,047 B2 * | 1/2005 | Ikehashi | ................ | G11C 7/062 365/189.15 |
| 7,012,846 B2 * | 3/2006 | Balasubramanian | .. | G11C 7/067 365/189.05 |
| 7,099,188 B1 * | 8/2006 | Wong | ...................... | G11C 11/56 365/185.03 |
| 7,251,178 B2 * | 7/2007 | Gogl | ....................... | G11C 7/02 327/53 |
| 7,542,337 B2 * | 6/2009 | Scheuerlein | ........... | G11C 11/56 365/185.03 |

(Continued)

*Primary Examiner* — Huan Hoang
*Assistant Examiner* — Roberto Mancera
(74) *Attorney, Agent, or Firm* — Cooper Legal Group, LLC

(57) ABSTRACT

A stabilizing circuit is provided that is connected to a biased voltage. The stabilizing circuit is configured to inhibit a change in voltage of the biased voltage caused by a first change in voltage of one or more nodes that are connected to the biased voltage through a first parasitic capacitance. In some embodiments, the stabilizing circuit induces a voltage on the biased voltage through a second parasitic capacitance that changes from a first voltage level to a second voltage level during the first change in voltage such that a total change in parasitic voltage that is induced at the biased voltage during the first change in voltage is close to 0 V.

20 Claims, 5 Drawing Sheets

(56) References Cited

U.S. PATENT DOCUMENTS

| | | | |
|---|---|---|---|
| 8,780,650 B2* | 7/2014 | Seningen et al. | 365/189.15 |
| 2003/0227797 A1* | 12/2003 | Jung | 365/189.05 |
| 2008/0106965 A1* | 5/2008 | Hirobe | G11O 5/147 |
| | | | 365/226 |

* cited by examiner

STABILIZING CIRCUIT

BACKGROUND

A MOS transistor comprises a parasitic capacitance between a drain of the MOS transistor and a gate of the MOS transistor, and also between a source of the MOS transistor and the gate of the MOS transistor. Sometimes, the parasitic capacitance limits a speed at which a device comprising the MOS transistor can operate. Sometimes, the parasitic capacitance can cause a memory device comprising the MOS transistor to read incorrect data.

Sometimes, the effects of the parasitic capacitance are inhibited by connecting a capacitor to the gate of the MOS transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
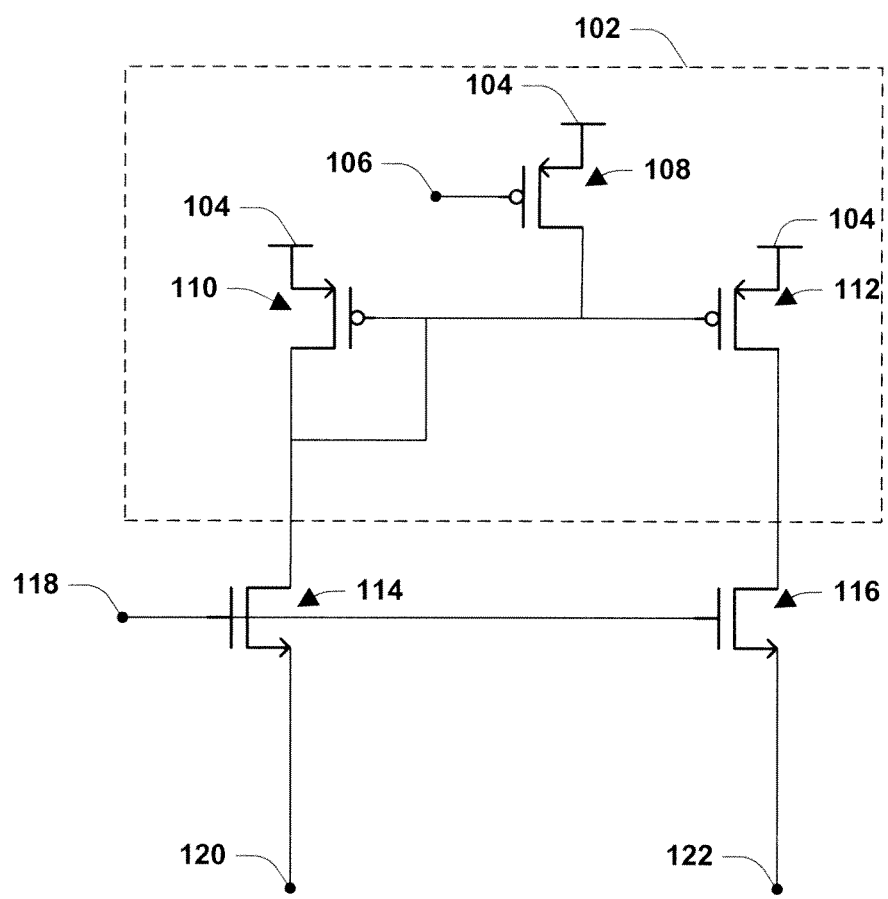
FIG. 1 is an illustration of a circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a first signal is provided. In some embodiments, the first signal is an analog signal. In some embodiments, the first signal is connected to a biasing circuit configured to adjust the voltage of the first signal. In some embodiments, the voltage of the first signal is constant. In some embodiments, when the voltage of the first signal is below the specified bias voltage, the biasing circuit increases the voltage of the first signal so that it is substantially equal to the specified bias voltage. In some embodiments, when the voltage of the first signal is above the specified bias voltage, the biasing circuit decreases the voltage of the first signal so that it is substantially equal to the specified bias voltage. In some embodiments, the first signal is provided to a plurality of transistors. In some embodiments, the first signal is provided to a gate of a first transistor and to a gate of a second transistor. In some embodiments, the first transistor comprises a first MOS transistor and the second transistor comprises a second MOS transistor. In some embodiments, the first transistor comprises a first NMOS transistor and the second transistor comprises a second NMOS transistor. In some embodiments, a first parasitic capacitance exists between a drain of the first NMOS transistor and the gate of the first NMOS transistor. In some embodiments, a second parasitic capacitance exists between a source of the first NMOS transistor and the gate of the first NMOS transistor. In some embodiments, a third parasitic capacitance exists between a drain of the second NMOS transistor and the gate of the second NMOS transistor. In some embodiments, a fourth parasitic capacitance exists between a source of the second NMOS transistor and the gate of the second NMOS transistor. In some embodiments, a first parasitic voltage exists that is a voltage induced on the first signal through the first parasitic capacitance. In some embodiments, a second parasitic voltage exists that is a voltage induced on the first signal through the second parasitic capacitance. In some embodiments, a third parasitic voltage exists that is a voltage induced on the first signal through the third parasitic capacitance. In some embodiments, a fourth parasitic voltage exists that is a voltage induced on the first signal through the fourth parasitic capacitance.

In some embodiments, during a first portion of time, a first change in voltage occurs and a second change in voltage occurs, simultaneously. In some embodiments, the first change in voltage is a first positive change in voltage. In some embodiments, the first change in voltage is a first negative change in voltage. In some embodiments, the second change in voltage is a second positive change in voltage. In some embodiments, the second change in voltage is a second negative change in voltage. In some embodiments, when the first change in voltage is the first positive change in voltage, the second change in voltage is the second positive change in voltage. In some embodiments, when the first change in voltage is the first negative change in voltage, the second change in voltage is the second negative change in voltage.

In some embodiments, the first positive change in voltage comprises a voltage at the drain of the first NMOS transistor and a voltage at the drain of the second NMOS transistor, respectively, changing from a first voltage level to a second voltage level. In some embodiments, the second positive change in voltage comprises a voltage at the source of the first NMOS transistor and a voltage at the source of the second NMOS transistor respectively changing from a third voltage level to a fourth voltage level. In some embodiments, the second voltage level is greater than the first voltage level. In some embodiments, the fourth voltage level is greater than the third voltage level. In some embodiments, the second voltage level is substantially equal to 5 V. In some embodiments, the second voltage level is between 3 V and 5 V. In some embodiments, the second voltage level is between 1 V and 3 V. In some embodiments, the second voltage level is greater than 5 V. In some embodiments, the first voltage level is substantially equal to 0 V. In some embodiments, the first voltage level is between 0 V and 1 V. In some embodiments, the fourth voltage level is substantially equal to 5 V. In some embodiments, the fourth voltage level is between 3 V and 5 V. In some embodiments, the fourth voltage level is between 1 V and 5 V. In some embodiments, the fourth voltage level is greater than 5 V. In some embodiments, the third voltage level is substantially equal to 0 V. In some embodiments, the third voltage level is between 0 V and 1 V.

In some embodiments, the first negative change in voltage comprises a voltage at the drain of the first NMOS transistor and a voltage at the drain of the second NMOS transistor respectively changing from a fifth voltage level to a sixth voltage level. In some embodiments, the second negative change in voltage comprises a voltage at the source of the first NMOS transistor and a voltage at the source of the second NMOS transistor respectively changing from a seventh voltage level to an eighth voltage level. In some embodiments, the fifth voltage level is greater than the sixth voltage level. In some embodiments, the seventh voltage level is greater than the eighth voltage level. In some embodiments, the fifth voltage level is substantially equal to 5 V. In some embodiments, the fifth voltage level is between 3 V and 5 V. In some embodiments, the fifth voltage level is between 1 V and 3 V. In some embodiments, the fifth voltage level is greater than 5 V. In some embodiments, the sixth voltage level is substantially equal to 0 V. In some embodiments, the sixth voltage level is between 0 V and 1 V. In some embodiments, the seventh voltage level is substantially equal to 5 V. In some embodiments, the seventh voltage level is between 3 V and 5 V. In some embodiments, the seventh voltage level is between 1 V and 5 V. In some embodiments, the seventh voltage level is greater than 5 V. In some embodiments, the eighth voltage level is substantially equal to 0 V. In some embodiments, the eighth voltage level is between 0 V and 1 V.

In some embodiments, when the first positive change in voltage occurs, the first parasitic voltage and the third parasitic voltage increase, respectively. In some embodiments, when the second positive change in voltage occurs, the second parasitic voltage and the fourth parasitic voltage increase, respectively. In this way, in some embodiments, during the first portion of time, the first parasitic voltage, the second parasitic voltage, the third parasitic voltage and the fourth parasitic voltage, respectively, increase. In some embodiments, the first parasitic voltage increase causes the voltage of the first signal to increase from the specified bias voltage to a voltage above the specified bias voltage. In some embodiments, the second parasitic voltage increase causes the voltage of the first signal to increase from the specified bias voltage to a voltage above the specified bias voltage. In some embodiments, the third parasitic voltage increase causes the voltage of the first signal to increase from the specified bias voltage to a voltage above the specified bias voltage. In some embodiments, the third parasitic voltage increase causes the voltage of the first signal to increase from the specified bias voltage to a voltage above the specified bias voltage. In some embodiments, the fourth parasitic voltage increase causes the voltage of the first signal to increase from the specified bias voltage to a voltage above the specified bias voltage. In some embodiments, when the voltage of the first signal increases above the specified bias voltage, the first signal is adjusted such that the voltage of the first signal is decreased to the specified bias voltage.

In some embodiments, when the first negative change in voltage occurs, the first parasitic voltage and the third parasitic voltage decrease, respectively. In some embodiments, when the second negative change in voltage occurs, the second parasitic voltage and the fourth parasitic voltage decrease, respectively. In this way, in some embodiments, during the first portion of time, the first parasitic voltage, the second parasitic voltage, the third parasitic voltage and the fourth parasitic voltage, respectively, decrease. In some embodiments, the first parasitic voltage decrease causes the voltage of the first signal to decrease from the specified bias voltage to a voltage below the specified bias voltage. In some embodiments, the second parasitic voltage decrease causes the voltage of the first signal to decrease from the specified bias voltage to a voltage below the specified bias voltage. In some embodiments, the third parasitic voltage decrease causes the voltage of the first signal to decrease from the specified bias voltage to a voltage below the specified bias voltage. In some embodiments, the third parasitic voltage decrease causes the voltage of the first signal to decrease from the specified bias voltage to a voltage below the specified bias voltage. In some embodiments, the fourth parasitic voltage decrease causes the voltage of the first signal to decrease from the specified bias voltage to a voltage below the specified bias voltage. In some embodiments, when the voltage of the first signal decreases below the specified bias voltage, the first signal is adjusted such that the voltage of the first signal is increased to the specified bias voltage.

In some embodiments, a length of time that the voltage of the first signal is not equal to the specified bias voltage is a function of a difference between the voltage of the first signal and the specified bias voltage. In some embodiments, as the difference between the voltage of the first signal and the specified bias voltage increases, the length of time that the voltage of the first signal is not equal to the specified bias voltage increases. In some embodiments, it is desired to limit the length of time that the voltage of the first signal is not equal to the specified bias voltage. In some embodiments, a total change in parasitic voltage is equal to the sum of the difference between the first parasitic voltage at the beginning of the first portion of time and the first parasitic voltage after the first change in voltage, the difference between the second parasitic voltage at the beginning of the first portion of time and the second parasitic voltage after the second change in voltage occurs, the difference between the third parasitic voltage at the beginning of the first portion of time and the third parasitic voltage after the first change in voltage occurs and the difference of the fourth parasitic voltage at the beginning of the first portion of time and the fourth parasitic voltage after the second change in voltage. In some embodiments, a difference between the voltage of the first signal and the specified bias voltage is a function of the total change in parasitic voltage. In some embodiments, as the total change in parasitic voltage increases, the difference between the voltage of the first signal and the specified bias voltage increases. In some embodiments, it is desired to limit the total change in parasitic voltage.

In some embodiments, a first circuit is provided that is configured to limit the total change in parasitic voltage. In some embodiments, the first circuit comprises a third transistor. In some embodiments, the third transistor is a third NMOS transistor. In some embodiments, the first signal exists at a gate of the third NMOS transistor. In some embodiments, a fifth parasitic capacitance exists between a drain of the third NMOS transistor and the gate of the third NMOS transistor. In some embodiments, a sixth parasitic capacitance exists between a source of the third NMOS transistor and the gate of the third NMOS transistor. In some embodiments, a fifth parasitic voltage exists that is a voltage induced on the first signal through the fifth parasitic capacitance. In some embodiments, a sixth parasitic voltage exists that is a voltage induced on the first signal through the sixth parasitic capacitance. In some embodiments, during the first portion of time, a third change in voltage occurs. In some embodiments, the first change in voltage, the second change in voltage and the third change in voltage occur simultaneously. In some embodiments, the third change in voltage is a third positive change in voltage. In some embodiments, the third change in voltage is a third negative change in voltage. In some embodiments, when the first change in voltage is the first positive change in voltage and the second change in voltage is the second positive change in voltage, respectively, the third change in voltage is the third negative change in voltage. In some embodiments, when the first change in voltage is the first negative change in voltage and the second change in voltage is the second negative change in voltage, respectively, the third change in voltage is the third positive change in voltage.

In some embodiments, during the first portion of time, a fourth change in voltage occurs. In some embodiments, the first change in voltage, the second change in voltage, the third change in voltage and the fourth change in voltage occur simultaneously. In some embodiments, the fourth change in voltage is a fourth positive change in voltage. In some embodiments, the fourth change in voltage is a fourth negative change in voltage. In some embodiments, when the first change in voltage is the first positive change in voltage, the second change in voltage is the second positive change in voltage and the third change in voltage is the third negative change in voltage, respectively, the fourth change in voltage is the fourth negative change in voltage. In some embodiments, when the first change in voltage is the first negative change in voltage, the second change in voltage is the second negative change in voltage and the third change in voltage is the third positive change in voltage, respectively, the fourth change in voltage is a fourth positive change in voltage.

In some embodiments, the third negative change in voltage comprises a voltage at the drain of the third NMOS transistor changing from a ninth voltage level to a tenth voltage level. In some embodiments, the fourth negative change in voltage comprises a voltage at the source of the third NMOS transistor changing from an eleventh voltage level to a twelfth voltage level. In some embodiments, the ninth voltage is greater than the tenth voltage. In some embodiments, the eleventh voltage is greater than the tenth voltage. In some embodiments, the ninth voltage level is substantially equal to 5 V. In some embodiments, the ninth voltage level is between 3 V and 5 V. In some embodiments, the ninth voltage level is between 1 V and 3 V. In some embodiments, the ninth voltage level is greater than 5 V. In some embodiments, the tenth voltage level is substantially equal to 0 V. In some embodiments, the tenth voltage level is between 0 V and 1 V. In some embodiments, the eleventh voltage level is substantially equal to 5 V. In some embodiments, the eleventh voltage level is between 3 V and 5 V. In some embodiments, the eleventh voltage level is between 1 V and 5 V. In some embodiments, the eleventh voltage level is greater than 5 V. In some embodiments, the twelfth voltage level is substantially equal to 0 V. In some embodiments, the twelfth voltage level is between 0 V and 1 V.

In some embodiments, the third positive change in voltage comprises a voltage at the drain of the first NMOS transistor changing from a thirteenth voltage level to a fourteenth voltage level. In some embodiments, the fourth positive change in voltage comprises a voltage at the source of the third NMOS transistor changing from a fifteenth voltage level to a sixteenth voltage level. In some embodiments, the fourteenth voltage level is greater than the thirteenth voltage level. In some embodiments, the fourteenth voltage level is greater than the thirteenth voltage level. In some embodiments, the fourteenth voltage level is substantially equal to 5 V. In some embodiments, the fourteenth voltage level is between 3 V and 5 V. In some embodiments, the fourteenth voltage level is between 1 V and 3 V. In some embodiments, the fourteenth voltage level is greater than 5 V. In some embodiments, the thirteenth voltage level is substantially equal to 0 V. In some embodiments, the thirteenth voltage level is between 0 V and 1 V. In some embodiments, the sixteenth voltage level is substantially equal to 5 V. In some embodiments, the sixteenth voltage level is between 3 V and 5 V. In some embodiments, the sixteenth voltage level is between 1 V and 5 V. In some embodiments, the sixteenth voltage level is greater than 5 V. In some embodiments, the fifteenth voltage level is substantially equal to 0 V. In some embodiments, the fifteenth voltage level is between 0 V and 1 V.

In some embodiments, when the third negative change in voltage occurs, the fifth parasitic voltage decreases. In some embodiments, when the fourth negative change in voltage occurs, the sixth parasitic voltage decreases. In this way, in some embodiments, during the first portion of time, the fifth parasitic voltage and the sixth parasitic voltage, respectively, decrease.

In some embodiments, when the third positive change in voltage occurs, the fifth parasitic voltage increases. In some embodiments, when the fourth positive change in voltage occurs, the sixth parasitic voltage increases. In this way, in some embodiments, during the first portion of time, the fifth parasitic voltage and the sixth parasitic voltage, respectively, decrease.

In some embodiments, the total change in parasitic voltage is equal to the sum of the difference between the first parasitic voltage at the beginning of the first portion of time and the first parasitic voltage after the first change in voltage, the difference between the second parasitic voltage at the beginning of the first portion of time and the second parasitic voltage after the second change in voltage occurs, the difference between the third parasitic voltage at the beginning of the first portion of time and the third parasitic voltage after the first change in voltage occurs, the difference of the fourth parasitic voltage at the beginning of the first portion of time and the fourth parasitic voltage after the second change in voltage, the difference of the fifth parasitic voltage at the beginning of the first portion of time and the fifth parasitic voltage after the second change in voltage and the difference of the sixth parasitic voltage at the beginning of the first portion of time and the sixth parasitic voltage after the second change in voltage.

In some embodiments, the fifth parasitic capacitance and the sixth parasitic capacitance are respectively configured such that the sum of a magnitude of the difference of the fifth parasitic voltage at the beginning of the first portion of time and the fifth parasitic voltage after the second change in voltage and a magnitude of the difference of the sixth parasitic voltage at the beginning of the first portion of time and the sixth parasitic voltage after the second change in voltage is substantially equal to the sum of the difference between the first parasitic voltage at the beginning of the first portion of time and the first parasitic voltage after the first change in voltage, the difference between the second parasitic voltage at the beginning of the first portion of time and the second parasitic voltage after the second change in voltage occurs, the difference between the third parasitic voltage at the beginning of the first portion of time and the third parasitic voltage after the first change in voltage occurs and the difference of the fourth parasitic voltage at the beginning of the first portion of time and the fourth parasitic voltage after the second change in voltage. In this way, the total change in parasitic voltage is substantially equal to 0 V. In some embodiments, the total change in parasitic voltage is close to 0 V but not 0 V, such as less than about 0.3 V.

In some embodiments, the ninth voltage level, the tenth voltage level, the eleventh voltage level and the twelfth voltage level are respectively configured such that the sum of a magnitude of the difference of the fifth parasitic voltage at the beginning of the first portion of time and the fifth parasitic voltage after the second change in voltage and a magnitude of the difference of the sixth parasitic voltage at the beginning of the first portion of time and the sixth parasitic voltage after the second change in voltage is substantially equal to the sum of the difference between the first parasitic voltage at the beginning of the first portion of time and the first parasitic voltage after the first change in voltage, the difference between the second parasitic voltage at the beginning of the first portion of time and the second parasitic voltage after the second change in voltage occurs, the difference between the third parasitic voltage at the beginning of the first portion of time and the third parasitic voltage after the first change in voltage occurs and the difference of the fourth parasitic voltage at the beginning of the first portion of time and the fourth parasitic voltage after the second change in voltage. In this way, the total change in parasitic voltage is substantially equal to 0 V. In some embodiments, the total change in parasitic voltage is close to 0 V but not 0 V, such as less than about 0.3 V.

In some embodiments, the thirteenth voltage level, the fourteenth voltage level, the fifteenth voltage level and the sixteenth voltage level are respectively configured such that the sum of a magnitude of the difference of the fifth parasitic voltage at the beginning of the first portion of time and the fifth parasitic voltage after the second change in voltage and a magnitude of the difference of the sixth parasitic voltage at the beginning of the first portion of time and the sixth parasitic voltage after the second change in voltage is substantially equal to the sum of the difference between the first parasitic voltage at the beginning of the first portion of time and the first parasitic voltage after the first change in voltage, the difference between the second parasitic voltage at the beginning of the first portion of time and the second parasitic voltage after the second change in voltage occurs, the difference between the third parasitic voltage at the beginning of the first portion of time and the third parasitic voltage after the first change in voltage occurs and the difference of the fourth parasitic voltage at the beginning of the first portion of time and the fourth parasitic voltage after the second change in voltage. In this way, the total change in parasitic voltage is substantially equal to 0 V. In some embodiments, the total change in parasitic voltage is close to 0 V but not 0 V, such as less than about 0.3 V.

A portion of a first sense amplifier comprised within a memory structure is illustrated in FIG. 1. In some embodiments, the first sense amplifier comprises a first transistor 114, a second transistor 116, and a first current mirror circuit 102. In some embodiments, the first current mirror circuit 102 comprises a third transistor 108, a fourth transistor 110 and a fifth transistor 112. In some embodiments, the first transistor 114 is an NMOS transistor. In some embodiments, the second transistor 116 is an NMOS transistor. In some embodiments, the third transistor 108 is a PMOS transistor. In some embodiments, the fourth transistor 110 is a PMOS transistor. In some embodiments, the fifth transistor 112 is a PMOS transistor. In some embodiments, a source of the third transistor 108 is connected to a first voltage source 104. In some embodiments, a gate of the third transistor 108 is connected to a first node 106. In some embodiments, the first node 106 is connected to a first sense amplifier enable signal. In some embodiments, a drain of the third transistor 108 is connected to a gate of the fourth transistor 110 and to a gate of the fifth transistor 112. In some embodiments, a source of the fourth transistor 110 is connected to the first voltage source 104. In some embodiments, a source of the fifth transistor 112 is connected to the first voltage source 104. In some embodiments, the gate of the fourth transistor 110 is connected to a drain of the fourth transistor 110. In some embodiments, the drain of the fourth transistor 110 is connected to a drain of the first transistor 114. In some embodiments, a drain of the fifth transistor 112 is connected to a drain of the second transistor 116. In some embodiments, a gate of the first transistor 114 is connected to a gate of the second transistor 116 and to a second node 118. In some embodiments, a second signal exists at the second node 118. In some embodiments, a voltage of the second signal is a biased voltage. In some embodiments, a source of the first transistor 114 is connected to a third node 120. In some embodiments, a source of the second transistor 116 is connected to a fourth node 122. In some embodiments, a first reference voltage signal exists at the third node 120. In some embodiments, the fourth node 122 is connected to a first memory cell.

In some embodiments, the first sense amplifier is operably coupled to a first IO port comprised within a memory device. In some embodiments, the first sense amplifier is operably coupled to a plurality of sense amplifiers in a memory arrangement. In some embodiments, the first sense amplifier is operably coupled to less than one hundred sense amplifiers in the memory arrangement. In some embodiments, the first sense amplifier is operably coupled to more than one hundred sense amplifiers in the memory arrangement. In some embodiments, each sense amplifier in the plurality of sense amplifiers is operably to an IO port comprised within the memory device.

Figure 2:
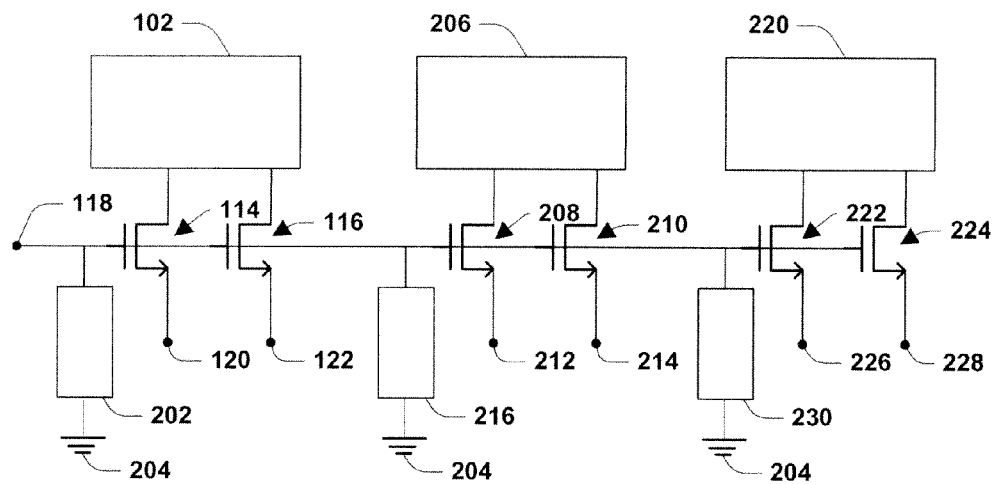
FIG. 2 is an illustration of a circuit, in accordance with some embodiments.

An illustration of a portion of a plurality of sense amplifiers in a memory arrangement is shown in FIG. 2. In some embodiments, the plurality of sense amplifiers comprises the first sense amplifier illustrated in FIG. 1. In some embodiments, the first sense amplifier is operably coupled to a second sense amplifier and to a third sense amplifier. In some embodiments, the plurality of sense amplifiers comprises more than three sense amplifiers. In some embodiments, the second sense amplifier is configured in the same way as the first sense amplifier. In some embodiments, the third sense amplifier is configured in the same way as the first sense amplifier. In some embodiments, the second amplifier comprises a second current mirror 206. In some embodiments, the second current mirror 206 is configured in the same way as the first current mirror 102. In some embodiments, the third amplifier comprises a third current mirror 220. In some embodiments, the third current mirror 220 is configured in the same way as the first current mirror 102.

In some embodiments, the second sense amplifier comprises a sixth transistor 208 and a seventh transistor 210. In some embodiments, the sixth transistor 208 comprises an NMOS transistor. In some embodiments, the seventh transistor 210 comprises an NMOS transistor. In some embodiments, a drain of the sixth transistor 208 is connected to the second current mirror 206. In some embodiments, a drain of the seventh transistor 210 is connected to the second current mirror 206. In some embodiments, a gate of the sixth transistor 208 is connected to the second node 118. In some embodiments, a gate of the seventh transistor 210 is connected to the second node 118. In some embodiments, a source of the sixth transistor 208 is connected to a fifth node 212. In some embodiments, a second voltage reference signal exists at the fifth node 212. In some embodiments, a source of the seventh transistor 210 is connected to a sixth node 214. In some embodiments, the sixth node 214 is connected to a second memory cell.

In some embodiments, the third sense amplifier comprises an eighth transistor 222 and a ninth transistor 224. In some embodiments, the eighth transistor 222 comprises an NMOS transistor. In some embodiments, the ninth transistor 224 comprises an NMOS transistor. In some embodiments, a drain of the eighth transistor 222 is connected to the third current mirror 220. In some embodiments, a drain of the ninth transistor 224 is connected to the third current mirror 220. In some embodiments, a gate of the eighth transistor 222 is connected to the second node 118. In some embodiments, a gate of the ninth transistor 224 is connected to the second node 118. In some embodiments, a source of the eighth transistor 226 is connected to a seventh node 226. In some embodiments, the seventh node 226 is connected to a third voltage reference signal. In some embodiments, a source of the ninth transistor 224 is connected to an eighth node 228. In some embodiments, the eighth node 228 is connected to a third memory cell.

In some embodiments, during a read cycle of the memory arrangement, a voltage at the drain of the first transistor 114 increases. In some embodiments, during the read cycle of the memory arrangement, a voltage at the source of the first transistor 114 increases. In some embodiments, during the read cycle of the memory arrangement, a voltage at the drain of the second transistor 116 increases. In some embodiments, during the read cycle of the memory arrangement, a voltage at the source of the second transistor 116 increases. In some embodiments, during the read cycle of the memory arrangement, a voltage at the drain of the sixth transistor 208 increases. In some embodiments, during the read cycle of the memory arrangement, a voltage at the source of the sixth transistor 208 increases. In some embodiments, during the read cycle of the memory arrangement, a voltage at the drain of the seventh transistor 210 increases. In some embodiments, during the read cycle of the memory arrangement, a voltage at the drain of the eighth transistor 222 increases. In some embodiments, during the read cycle of the memory arrangement, a voltage at the source of the eighth transistor 222 increases. In some embodiments, during the read cycle of the memory arrangement, a voltage at the drain of the ninth transistor 224 increases. In some embodiments, during the read cycle of the memory arrangement, a voltage at the source of the ninth transistor 224 increases.

In some embodiments, during the read cycle of the memory arrangement, a change in parasitic voltage induced on the second node 118 occurs has a magnitude that is a function of a number of sense amplifiers comprised by the plurality of sense amplifiers within the memory arrangement. In some embodiments, one or more capacitors are connected to the second node 118, in order to inhibit the change in parasitic voltage from changing the biased voltage at the second node 118. In some embodiments, it is desired to limit the area of the memory device. In some embodiments, a circuit comprising transistors occupies less space than a capacitor.

In some embodiments, a first stabilizing circuit 202, a second stabilizing circuit 216 and a third stabilizing circuit 230 are respectively connected to the second node 118. In some embodiments, the first stabilizing circuit 202 is connected to a second voltage source 204. In some embodiments, the second stabilizing circuit 216 is connected to the second voltage source 204. In some embodiments, the third stabilizing circuit 230 is connected to the second voltage source 204. In some embodiments, the second voltage source 204 is ground. In some embodiments, the second stabilizing circuit 216 has the same configuration as the first stabilizing circuit 202. In some embodiments, the third stabilizing circuit 230 has the same configuration as the first stabilizing circuit 202. In some embodiments, the first stabilizing circuit 202, the second stabilizing circuit 216 and the third stabilizing circuit 230 are configured to inhibit the change in parasitic voltage within the plurality of sense amplifiers from changing the biased voltage at the second node 118. In some embodiments, the memory arrangement comprises a number of sense amplifiers equal to a number of stabilizing circuits comprised within the memory arrangement. In some embodiments the memory arrangement comprises a number of sense amplifiers less than a number of stabilizing circuits comprised within the memory arrangement. In some embodiments the memory arrangement comprises a number of sense amplifiers greater than a number of stabilizing circuits comprised within the memory arrangement.

Figure 3:
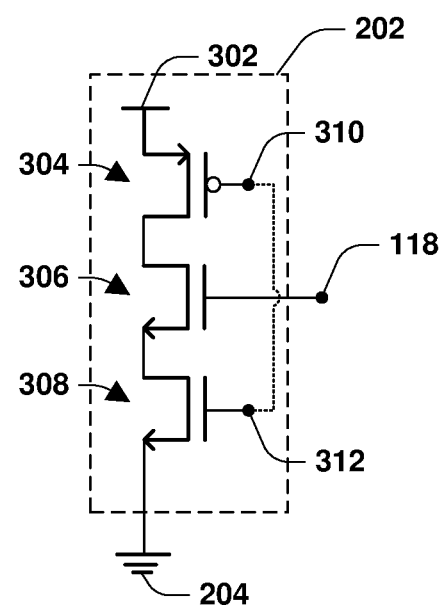
FIG. 3 is an illustration of a circuit, in accordance with some embodiments.

An illustration of the first stabilizing circuit 202 is shown in FIG. 3. In some embodiments, the first stabilizing circuit 202 comprises a tenth transistor 304, an eleventh transistor 306 and a twelfth transistor 308. In some embodiments, the tenth transistor 304 is a PMOS transistor. In some embodiments, the eleventh transistor 306 is an NMOS transistor. In some embodiments, the twelfth transistor 308 is an NMOS transistor. In some embodiments, a source of the tenth transistor 304 is connected to a third voltage source 302. In some embodiments, the third voltage source 302 comprises a voltage substantially equal to a voltage of the first voltage source 104. In some embodiments, a gate of the tenth transistor 304 is connected to a ninth node 310. In some embodiments, a drain of the tenth transistor 304 is connected to a drain of the eleventh transistor 306. In some embodiments, a gate of the eleventh transistor 306 is connected to the second node 118. In some embodiments, a source of the eleventh transistor 306 is connected to a drain of the twelfth transistor 308. In some embodiments, a gate of the twelfth transistor 308 is connected to a tenth node 312. In some embodiments, a source of the twelfth transistor 308 is connected to the second voltage source 204. In some embodiments, a third signal exists at the ninth node 310. In some embodiments, the third signal exists at the tenth node 312.

In some embodiments, before the read cycle of the memory arrangement begins, the third signal has a voltage configured to activate the tenth transistor 304 and deactivate the twelfth transistor 308. In some embodiments, before the read cycle of the memory arrangement begins, the third signal has a voltage equal to the voltage of the third voltage source 302. In some embodiments, the voltage of the third voltage source 302 is substantially equal to 5 V. In some embodiments, during the read cycle of the memory cell, the third signal changes to a voltage configured to deactivate the tenth transistor 304 and activate the twelfth transistor 308. In some embodiments, a change in parasitic voltage induced on the second node 118 from the first stabilizing circuit 202 occurs during the read cycle of the memory arrangement. In some embodiments, a magnitude of a total stabilizing circuit change in parasitic voltage induced on the second node 118 by each of the stabilizing circuits within the memory device is configured to be substantially equal to a total sense amplifier change in parasitic voltage induced on the second node 118 by each of the sense amplifiers within the memory device. In this way, the total change in parasitic voltage induced on the second node 118 is substantially equal to 0 V. In some embodiments, the total change in parasitic voltage induced on the second node 118 is close to 0 V but not 0 V, such as less than about 0.3 V.

Figure 4:
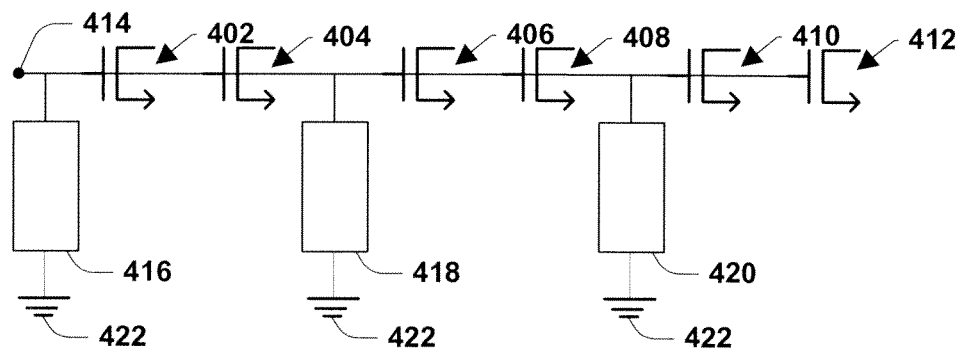
FIG. 4 is an illustration of a circuit, in accordance with some embodiments.

An illustration of a portion of a plurality of transistors connected to an eleventh node 414 is shown in FIG. 4. In some embodiments, the plurality of transistors comprises a thirteenth transistor 402, a fourteenth transistor 404, a fifteenth transistor 406, a sixteenth transistor 408, a seventeenth transistor 410 and an eighteenth transistor 412. In some embodiments, there are more than six transistors comprised within the plurality of transistors. In some embodiments, a plurality of stabilizing circuits is connected to the eleventh node 414. In some embodiments, the plurality of stabilizing circuits comprises a fourth stabilizing circuit 416, a fifth stabilizing circuit 418 and a sixth stabilizing circuit 420. In some embodiments, there are more than three stabilizing circuits comprised within the plurality of stabilizing circuits. In some embodiments, for every stabilizing circuit comprised within the plurality of stabilizing circuits, a transistor exists comprised within the plurality of transistors. In some embodiments, for every stabilizing circuit comprised within the plurality of stabilizing circuits, two transistors exist comprised within the plurality of transistors. In some embodiments, for every stabilizing circuit comprised within the plurality of stabilizing circuits, more than two transistors exist comprised within the plurality of transistors.

In some embodiments, a fourth signal exists at the eleventh node 414. In some embodiments, the fourth signal is an analog signal. In some embodiments, a voltage of the fourth signal is a constant biased voltage. In some embodiments, a gate of the thirteenth transistor 402 is connected to the eleventh node 414. In some embodiments, a gate of the fourteenth transistor 404 is connected to the eleventh node 414. In some embodiments, a gate of the fifteenth transistor 406 is connected to the eleventh node 414. In some embodiments, a gate of the sixteenth transistor 408 is connected to the eleventh node 414. In some embodiments, a gate of the seventeenth transistor 410 is connected to the eleventh node 414. In some embodiments, a gate of the eighteenth transistor 412 is connected to the eleventh node 414. In some embodiments, the fourth stabilizing circuit 416 is connected to the eleventh node 414. In some embodiments, the fourth stabilizing circuit 416 is connected to a fourth voltage source 422. In some embodiments, the fourth voltage source 422 is ground. In some embodiments, the fifth stabilizing circuit 418 is connected to the eleventh node 414. In some embodiments, the fifth stabilizing circuit 418 is connected to the fourth voltage source 422. In some embodiments, the sixth stabilizing circuit 420 is connected to the eleventh node 414.

In some embodiments, the sixth stabilizing circuit 420 is connected to the fourth voltage source 422. In some embodiments, the fourth stabilizing circuit 416 has the same configuration as every other stabilizing circuit comprised within the plurality of stabilizing circuits. In some embodiments, the fourth stabilizing circuit 416 has the same configuration as the first stabilizing circuit 202. In some embodiments, the fourth stabilizing circuit 416 has a different configuration as the first stabilizing circuit 202.

In some embodiments, during a second portion of time, a voltage at a drain of the thirteenth transistor 402 increases. In some embodiments, during the second period of time, a voltage at a source of the thirteenth transistor 402 increases. In some embodiments, during the second portion of time, a voltage at a drain of the fourteenth transistor 404 increases. In some embodiments, during the second period of time, a voltage at a source of the fourteenth transistor 404 increases. In some embodiments, during the second portion of time, a voltage at a drain of the fifteenth transistor 406 increases. In some embodiments, during the second period of time, a voltage at a source of the fifteenth transistor 406 increases. In some embodiments, during the second portion of time, a voltage at a drain of the sixteenth transistor 408 increases. In some embodiments, during the second period of time, a voltage at a source of the sixteenth transistor 408 increases. In some embodiments, during the second portion of time, a voltage at a drain of the seventeenth transistor 410 increases. In some embodiments, during the second period of time, a voltage at a source of the seventeenth transistor 410 increases. In some embodiments, during the second portion of time, a voltage at a drain of the eighteenth transistor 412 increases. In some embodiments, during the second period of time, a voltage at a source of the eighteenth transistor 412 increases.

In some embodiments, a seventh parasitic voltage is induced on the eleventh node 414 by the plurality of transistors. In some embodiments, during the second portion of time, the seventh parasitic voltage increases. In some embodiments, during the second portion of time, an eighth parasitic voltage is induced on the eleventh node 414 by the plurality of stabilizing circuits. In some embodiments, during the second portion of time, the plurality of stabilizing circuits is configured to decrease the eighth parasitic voltage in such a way that a magnitude of a change in the seventh parasitic voltage is substantially equal to a magnitude of a change in the eighth parasitic voltage during the second portion of time. In this way, a total change in parasitic voltage induced on the eleventh node 414 during the second portion of time is substantially equal to 0 V. In some embodiments, the total change in parasitic voltage induced on the eleventh node 414 during the second portion of time is close to 0 V but not 0 V, such as less than about 0.3 V.

In some embodiments, during the second portion of time, a voltage at the drain of the thirteenth transistor 402 decreases. In some embodiments, during the second period of time, a voltage at the source of the thirteenth transistor 402 decreases. In some embodiments, during the second portion of time, a voltage at the drain of the fourteenth transistor 404 decreases. In some embodiments, during the second period of time, a voltage at the source of the fourteenth transistor 404 decreases. In some embodiments, during the second portion of time, a voltage at the drain of the fifteenth transistor 406 decreases. In some embodiments, during the second period of time, a voltage at the source of the fifteenth transistor 406 decreases. In some embodiments, during the second portion of time, a voltage at the drain of the sixteenth transistor 408 decreases. In some embodiments, during the second period of time, a voltage at the source of the sixteenth transistor 408 decreases. In some embodiments, during the second portion of time, a voltage at the drain of the seventeenth transistor 410 decreases. In some embodiments, during the second period of time, a voltage at the source of the seventeenth transistor 410 decreases. In some embodiments, during the second portion of time, a voltage at the drain of the eighteenth transistor 412 decreases. In some embodiments, during the second period of time, a voltage at the source of the eighteenth transistor 412 decreases.

In some embodiments, during the second portion of time, the seventh parasitic voltage decreases. In some embodiments, during the second portion of time, the plurality of stabilizing circuits is configured to increase the eighth parasitic voltage in such a way that a magnitude of a change in the seventh parasitic voltage is substantially equal to a magnitude of a change in the eighth parasitic voltage during the second portion of time. In this way, a total change in parasitic voltage induced on the eleventh node 414 during the second portion of time is substantially equal to 0 V. In some embodiments, the total change in parasitic voltage induced on the eleventh node 414 is close to 0 V but not 0 V, such as less than about 0.3 V.

Figure 5:
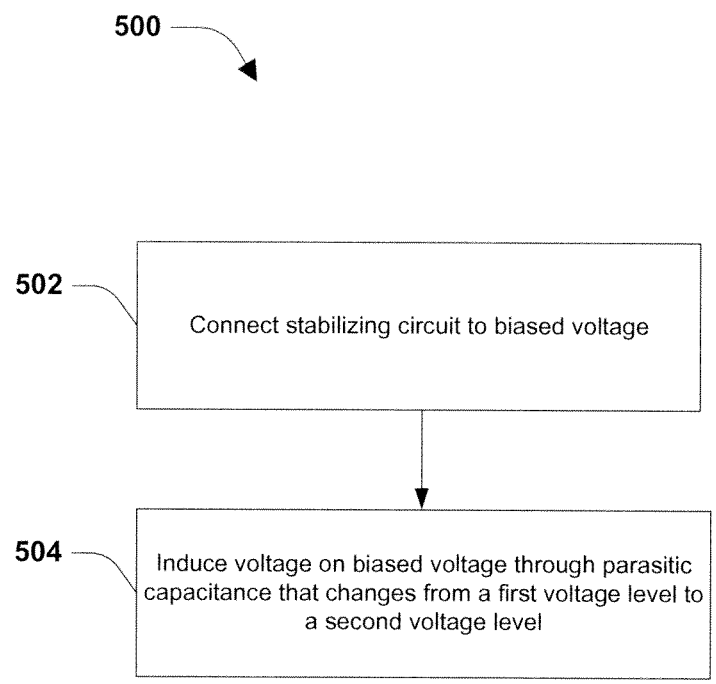
FIG. 5 illustrates a flow diagram of a method, in accordance with some embodiments.

FIG. 5 illustrates a method of inhibiting a voltage level change of a biased voltage at a first node caused by a first change in voltage at a second node that is coupled with the first node through a first parasitic capacitance. At 502, a stabilizing circuit is connected to the first node. At 504, the stabilizing circuit induces a voltage on the first node through a second parasitic capacitance that changes from a first voltage level to a second voltage level. In some embodiments, the first voltage level and the second voltage level are configured such that a total change in parasitic voltage induced at the first node during the first change in voltage is substantially equal to 0 V. In some embodiments, the total change in parasitic voltage induced on the eleventh node 414 is close to 0 V but not 0 V, such as less than about 0.3 V.

According to some embodiments, a memory structure is provided, comprising a first transistor, a second transistor, and a first transistor. The first transistor is connected to a node with a constant bias voltage and the second transistor is connected to the node. The first circuit is configured to inhibit a change in voltage of the constant bias voltage caused by parasitic capacitance within the memory structure. The first circuit comprises a third transistor.

According to some embodiments, a first stabilizing circuit is provided that is connected to a second circuit. The first stabilizing circuit comprises a first transistor, a second transistor and a third transistor. The second transistor is connected to a first node with a constant biased voltage. The second circuit is connected to the first node. The first stabilizing circuit is configured to inhibit a change in voltage of the constant biased voltage caused by a change in voltage at a second node in the second circuit that is connected to the first node through parasitic capacitance.

According to some embodiments, a method of inhibiting a voltage level change of a biased voltage at a first node caused by a first change in voltage at a second node that is coupled with the first node through a first parasitic capacitance is provided. The method comprises connecting a stabilizing circuit to the first node, the stabilizing circuit comprising one or more transistors. The method also comprises using the stabilizing circuit to induce a voltage on the first node through a second parasitic capacitance that changes from a first voltage level to a second voltage level during the first change in voltage, such that a total change in parasitic voltage induced on the first node during the first change in voltage is substantially equal to 0 V.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A memory structure, comprising:
a first transistor having a gate;

a second transistor having a gate, the gate of the first transistor and the gate of the second transistor operably coupled to a first node having a constant biased voltage;

a first circuit configured to inhibit a change in voltage of the constant biased voltage, the first circuit comprising:
- a third transistor having a first source/drain region operably coupled to a voltage source;
- a fourth transistor having a first source/drain region operably coupled to a second source/drain region of the third transistor and a gate operably coupled to the first node; and
- a fifth transistor having a first source/drain region operably coupled to a second source/drain region of the fourth transistor, wherein the third transistor, the fourth transistor, and the fifth transistor are electrically coupled in series; and a current mirror circuit, comprising:
- a sixth transistor comprising a first source/drain region operably coupled to a first source/drain region of the first transistor;
- a seventh transistor comprising a first source/drain region operably coupled to a first source/drain region of the second transistor; and
- an eighth transistor comprising a first source/drain region operably coupled to a gate of the sixth transistor and a gate of the seventh transistor.

2. The memory structure of claim 1, comprised within an integrated circuit using complementary metal-oxide semiconductor (CMOS) technology.

3. The memory structure of claim 1, the first transistor comprising an NMOS transistor.

4. The memory structure of claim 3, the second transistor comprising an NMOS transistor.

5. The memory structure of claim 1, the third transistor comprising a PMOS transistor.

6. The memory structure of claim 1, a gate of the third transistor and a gate of the fifth transistor operably coupled to a second node different than the first node.

7. The memory structure of claim 1, the first source/drain region of the eighth transistor, the gate of the sixth transistor, and the gate of the seventh transistor operably coupled to a second node different than the first node.

8. The memory structure of claim 1, a second source/drain region of the second transistor operably coupled to a memory cell.

9. The memory structure of claim 1, the first transistor, the second transistor and the current mirror circuit comprised within a first sense amplifier circuit.

10. The memory structure of claim 9, the first sense amplifier circuit comprised within a memory arrangement comprising a plurality of sense amplifier circuits.

11. The memory structure of claim 1, a voltage at a first source/drain region of the first transistor increasing from a first voltage to a second voltage during a read operation of the memory structure.

12. The memory structure of claim 11, the first voltage substantially equal to 0 V and the second voltage substantially equal to 5 V.

13. The memory structure of claim 11, a voltage at a second source/drain region of the first transistor increasing during the read operation of the memory structure.

14. The memory structure of claim 1, the voltage source applying a voltage to the first source/drain region of the third transistor that is equal to a first voltage level applied to a first source/drain region of the first transistor during a read operation of the memory structure.

15. The memory structure of claim 1, the fifth transistor having a second source/drain region operably coupled to a second voltage source applying a voltage to the second source/drain region of the fifth transistor that is equal to a second voltage level applied to a first source/drain region of the first transistor during a read operation of the memory structure.

16. A first stabilizing circuit operably coupled to a second circuit, the first stabilizing circuit comprising:
- a first transistor having a first source/drain region operably coupled to a voltage source;
- a second transistor having a first source/drain region operably coupled to a second source/drain region of the first transistor and a gate operably coupled to a first node having a constant biased voltage and operably coupling the first stabilizing circuit to the second circuit, wherein the second source/drain region of the first transistor and the first source/drain region of the second transistor are operably coupled to a second node different than the first node; and
- a third transistor having a first source/drain region operably coupled to a second source/drain region of the second transistor, wherein:
  - the first stabilizing circuit is configured to inhibit a change in the constant biased voltage,
  - a gate of the first transistor and a gate of the third transistor are operably coupled to a third node different than the first node and the second node, and
  - the first transistor, the second transistor, and the third transistor are electrically coupled in series.

17. The first stabilizing circuit of claim 16, wherein the first stabilizing circuit is operably coupled to a second stabilizing circuit.

18. A memory structure, comprising:
a first transistor having a gate;
a second transistor having a gate, the gate of the first transistor and the gate of the second transistor operably coupled to a first node having a constant biased voltage;
a first circuit configured to inhibit a change in voltage of the constant biased voltage, the first circuit comprising:
- a third transistor having a first source/drain region operably coupled to a voltage source and a second source/drain region operably coupled to a second node different than the first node;
- a fourth transistor having a first source/drain region operably coupled to the second node, a gate operably coupled to the first node, and a second source/drain region operably coupled to a third node different than the first node and the second node; and
- a fifth transistor having a first source/drain region operably coupled to the third node wherein:
  - a gate of the third transistor and a gate of the fifth transistor are operably coupled to a fourth node different than the first node, the second node, and the third node, and
  - the third transistor, the fourth transistor, and the fifth transistor are electrically coupled in series; and
a current mirror circuit, comprising:
- a sixth transistor having a first source/drain region and a gate operably coupled to a first source/drain region of the first transistor.

19. The memory structure of claim 18, the current mirror circuit comprising:
- a seventh transistor comprising a first source/drain region operably coupled to a first source/drain region of the second transistor; and an eighth transistor comprising a first source/drain region operably coupled to the gate of the sixth transistor and a gate of the seventh transistor.

20. The memory structure of claim 19, the first source/drain region of the eighth transistor operably coupled to the first source/drain region of the first transistor.

* * * * *